United States Patent
Cherala et al.

(10) Patent No.: US 11,550,216 B2
(45) Date of Patent: Jan. 10, 2023

(54) SYSTEMS AND METHODS FOR CURING A SHAPED FILM

(71) Applicant: CANON KABUSHIKI KAISHA, Tokyo (JP)

(72) Inventors: Anshuman Cherala, Austin, TX (US); Mario Johannes Meissl, Austin, TX (US); Byung-Jin Choi, Austin, TX (US)

(73) Assignee: CANON KABUSHIKI KAISHA, Tokyo (JP)

(*) Notice: Subject to any disclaimer, the term of this patent is extended or adjusted under 35 U.S.C. 154(b) by 405 days.

(21) Appl. No.: 16/693,599

(22) Filed: Nov. 25, 2019

(65) Prior Publication Data

US 2021/0157229 A1 May 27, 2021

(51) Int. Cl.
| | | |
|---|---|---|
| G03F 7/00 | (2006.01) | |
| H01L 21/68 | (2006.01) | |
| H01L 21/67 | (2006.01) | |
| H01L 21/3105 | (2006.01) | |

(52) U.S. Cl.
CPC ...... *G03F 7/0002* (2013.01); *H01L 21/31058* (2013.01); *H01L 21/6715* (2013.01); *H01L 21/68* (2013.01)

(58) Field of Classification Search
CPC ............. G03F 7/0002; H01L 21/31058; H01L 21/6715; H01L 21/68; H01L 21/02288; H01L 21/02345; H01L 21/31051; A61B 5/165; A61B 5/7264; A61B 5/7278; G16H 10/20; G16H 50/20
See application file for complete search history.

(56) References Cited

U.S. PATENT DOCUMENTS

| | | | |
|---|---|---|---|
| 7,157,036 B2 | 1/2007 | Choi et al. | |
| 8,076,386 B2 | 12/2011 | Xu et al. | |
| 8,394,282 B2 | 3/2013 | Panga et al. | |
| 8,404,170 B2 | 3/2013 | Koole et al. | |
| 8,409,671 B2 | 4/2013 | Ozawa et al. | |
| 9,718,096 B2 | 8/2017 | Sreenivasan et al. | |
| 9,971,249 B1 | 5/2018 | Bamesberger et al. | |
| 9,987,653 B2 | 6/2018 | Sreenivasan et al. | |
| 9,993,962 B2 | 6/2018 | Cherala | |
| 2010/0096764 A1 | 4/2010 | Lu | |

(Continued)

FOREIGN PATENT DOCUMENTS

| | | |
|---|---|---|
| JP | 2003311831 A | 11/2003 |
| JP | 4928963 B2 | 5/2012 |

(Continued)

*Primary Examiner* — Deoram Persaud
(74) *Attorney, Agent, or Firm* — Daniel Ratoff

(57) ABSTRACT

Systems and methods for shaping a film. The method of shaping a film may comprise dispensing a polymerizable fluid as a plurality of droplets onto a substrate. The method of shaping a film may further comprise bringing an initial superstrate contact region of a superstrate into contact with an initial subset of droplets of the plurality of droplets. The initial subset of droplets may merge and form an initial fluid film over the initial substrate contact region. The method of shaping a film may further comprise prior to the superstrate coming into contact with the remaining plurality of droplets on the substrate, polymerizing a region of the initial fluid film on the initial substrate contact region.

17 Claims, 8 Drawing Sheets

(56) References Cited

U.S. PATENT DOCUMENTS

| | | | |
|---|---|---|---|
| 2017/0106399 A1* | 4/2017 | Sreenivasan | B05C 13/00 |
| 2018/0301331 A1* | 10/2018 | Yoshida | G03F 7/0002 |
| 2019/0080922 A1* | 3/2019 | Khusnatdinov | H01L 21/02345 |
| 2019/0101823 A1 | 4/2019 | Patel et al. | |
| 2019/0179228 A1* | 6/2019 | Khusnatdinov | G03F 7/0002 |
| 2021/0096462 A1* | 4/2021 | Ito | G03F 9/7042 |
| 2021/0402677 A1* | 12/2021 | Khusnatdinov | B29C 59/002 |

FOREIGN PATENT DOCUMENTS

| | | |
|---|---|---|
| JP | 2019-021911 A | 2/2019 |
| TW | 201934297 A | 9/2019 |

\* cited by examiner

| Steps | Tasks | Time |
|---|---|---|
| S202 | Dispense formable material | |
| S204 | Contact formable material with the shaping surface | |
| S206 | Formable material spreads | |
| S208 | Cure formable material | |
| S210 | Separate superstrate from cured formable material | $t_c$ |
| S212 | Process the substrate | |

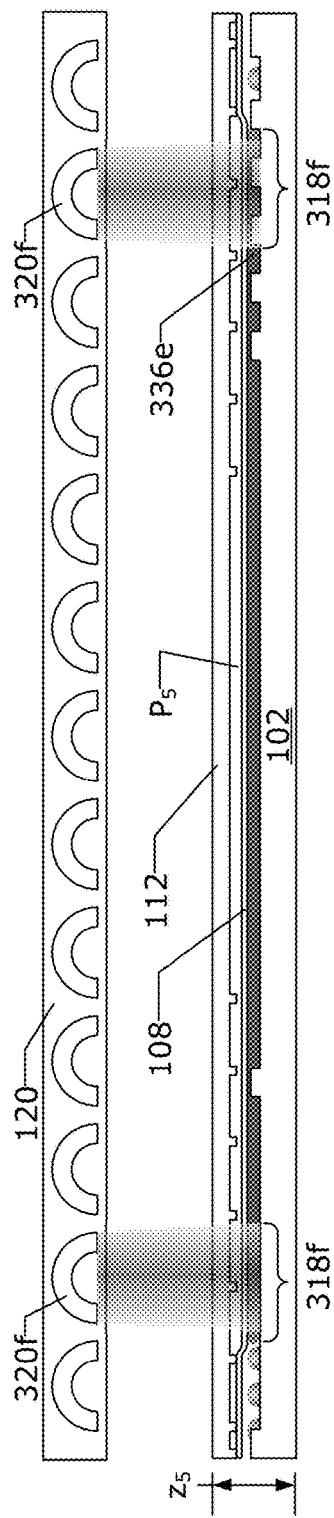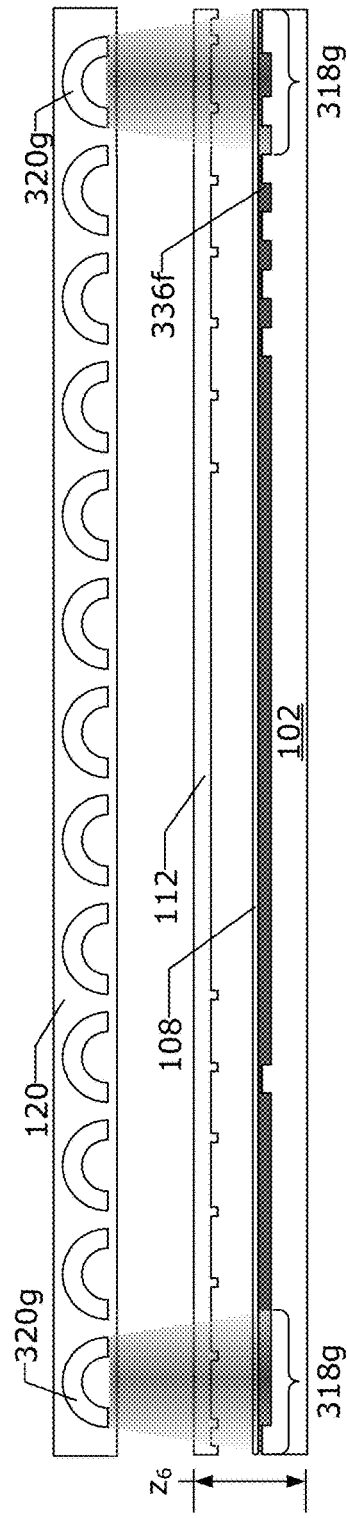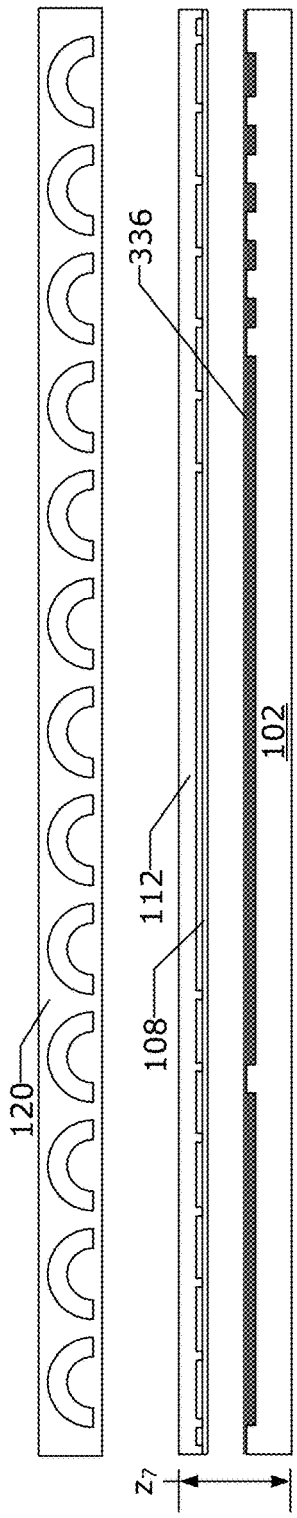

SYSTEMS AND METHODS FOR CURING A SHAPED FILM

BACKGROUND OF INVENTION

Technical Field

The present disclosure relates to systems and methods for curing a shaped film.

Description of the Related Art

Substrates can be processed using a variety of techniques which can be broadly divided into: step and repeat processes; scanning processes; and whole substrate processes. A whole substrate process in the present context is a process that is applied to the entire substrate. An example of a whole substrate processing technique is planarization. Planarization is useful for the fabrication of various devices including but not limited to: semiconductor devices; optical devices; and biotechnology devices. For example, the process for creating a semiconductor device includes repeatedly adding and removing material to and from a substrate. This process can produce a layered substrate with irregular height variations (i.e., topography). As more layers are added the substrate height variation can increase. This height variation has a negative impact on the quality of further layers added to the substrate. In addition, there are limits to the flatness that is obtainable with reasonable costs on an unpatterned substrate (e.g., silicon wafers).

One method of addressing this issue is to planarize the substrate between layering steps. Various lithographic patterning methods benefit from patterning on a planar surface. For example, better planarization can improve one or more of: depth of focus (DOF), critical dimension (CD), CD uniformity; feature placement; nanoimprint feature filling; and pattern transfer. There are occasions when planarization is desired on a first length scale while specific top surface variations are desired on a length scale larger than the first length scale.

One method of performing planarization is inkjet-based adaptive planarization (IAP) as described in US Patent Publication No. 2019/0080922. IAP involves dispensing a drop pattern of formable material onto a substrate. A superstrate is then brought into contact with the drop pattern. The formable material between the superstrate and the substrate is then cured. The superstrate is then removed. The cured formable material takes on the shape of superstrate.

The substrate and the cured formable material may then be subjected to known steps and processes for device (article) fabrication, including but not limited to: imprint lithography; photolithography; baking; oxidation; layer formation; deposition; doping; etching; descumming; dicing; bonding; packaging; etc.

SUMMARY OF THE INVENTION

A first embodiment, may be a method of shaping a film. The method of shaping a film may comprise dispensing a polymerizable fluid as a plurality of droplets onto a substrate. The method of shaping a film may further comprise bringing an initial superstrate contact region of a superstrate into contact with an initial subset of droplets of the plurality of droplets. The initial subset of droplets may merge and form an initial fluid film over the initial substrate contact region. The method of shaping a film may further comprise prior to the superstrate coming into contact with the remaining plurality of droplets on the substrate, polymerizing a region of the initial fluid film on the initial substrate contact region.

In an aspect of the first embodiment, the polymerizing step may be performed at a time $\Delta t$ after the initial superstrate contact region is brought into contact with the initial subset of droplets. The time $\Delta t$ may be selected to yield a polymerized film on the first substrate region having a desired film characteristic.

In an aspect of the first embodiment, the desired film characteristic may be one of: a film thickness of the polymerized film; a top layer thickness (TLT) of the polymerized film; and a surface shape of the polymerized film.

In an aspect of the first embodiment, the desired film characteristic may be a surface shape of the polymerized film that compensates for an overlay error between the superstrate and the substrate.

In an aspect of the first embodiment, the polymerizing step may be initiated by provided actinic radiation to the region of the initial fluid film at a reaction initiation time prior to the time $\Delta t$ after the initial superstrate contact region is brought into contact with the initial subset of droplets.

In an aspect of the first embodiment, the polymerizing step may be performed by sending actinic radiation through the superstrate and exposing the region of the initial fluid film in the initial substrate contact region to the actinic radiation, while not exposing polymerizable material in the regions surrounding the initial substrate contact region to the actinic radiation.

In an aspect of the first embodiment, bringing the initial superstrate contact region of the superstrate into contact with the initial subset of droplets of the plurality of droplets may comprise: adjusting a relative position of the superstrate to the substrate; and adjusting a distribution of pressure applied to a backside of the superstrate.

In an aspect of the first embodiment, the superstrate is divided into the initial superstrate contact region and a plurality of concentric regions that surround that superstrate contact region, the method may further comprise: adjusting a relative position of the superstrate to the substrate along a relative position trajectory; and adjusting a distribution of pressure applied to a backside of the superstrate along a distribution of pressure trajectory. The relative position trajectory and the distribution of pressure trajectory may be adjusted such that each of the plurality of concentric regions are sequentially brought into contact with subsets of the plurality of droplets on the substrate forming an expanding fluid film between the superstrate and the substrate.

In an aspect of the first embodiment, an outer boundary of the expanding fluid film may follow a contact line trajectory. The polymerizing step may be performed by sending actinic radiation through the superstrate and exposing the expanding fluid film to the actinic radiation with a spatio-temporal distribution of actinic radiation. A spatial component of the spatio-temporal distribution of actinic radiation may vary within a period of time during which the superstrate is in contact with the superstrate.

In an aspect of the first embodiment, an outer boundary of the expanding fluid film may follow behind the contact line trajectory. The spatial component of the spatio-temporal distribution of actinic radiation may follow behind the outer boundary of the expanding fluid film.

In an aspect of the first embodiment, the polymerizing step may be performed by sending a plurality of instructions to a plurality of actinic radiation sources. The plurality of instructions may include, for each of the plurality of actinic radiation sources, a turn on time and a turn off time, relative to a contact time. The contact time may be a time at which the initial superstrate contact region is brought into contact with the initial subset of droplets.

In an aspect of the first embodiment, the turn on time for each of the plurality actinic radiation sources may be selected to yield a polymerized film having a desired film characteristic on each region of the substrate associated with each actinic radiation source.

In an aspect of the first embodiment, the plurality of droplets may be arranged on the substrate in a droplet pattern such that a contact shape of portions of the superstrate vary from a non-relaxed state that is non-conformal with portions of the substrate to a relaxed shape that is conformal with the portions of the substrate, over a relaxation period $\Delta t_R$. The polymerizing step may be performed at an exposure time before the end of the relaxation period $\Delta t_R$ for each portion of the substrate associated with a particular source of irradiation among a plurality of radiation sources that provide actinic radiation.

In an aspect of the first embodiment, a spatial component of a spatio-temporal distribution of actinic radiation may be used to polymerize an expanding fluid film of the polymerizable fluid varies within a period of time during which the superstrate is in contact with the superstrate.

In an aspect of the first embodiment, a spatial component of the spatio-temporal distribution of actinic radiation may follow behind the outer boundary of an expanding fluid film of the polymerizable fluid.

The first embodiment may further comprise, using the method of shaping the film in a method of manufacturing articles. The method of manufacturing articles may further comprise processing the substrate on which the shaped film is produced so as to manufacture the articles.

A second embodiment, may be a system for shaping a film on a substrate. The system may comprise a substrate chuck configured to hold the substrate. The system may further comprise a dispenser configured to dispense a polymerizable fluid as a plurality of droplets onto the substrate. The system may further comprise a positioning system configured to move the substrate chuck relative to the superstrate chuck. The system may further comprise actinic radiation source. The system may further comprise a memory. The system may further comprise a processor. The processor may be configured to: send instructions to the superstrate chuck and the positioning system to bring an initial superstrate contact region of the superstrate into contact with an initial subset of droplets of the plurality of droplets, wherein the initial subset of droplets merge and form an initial fluid film over the initial substrate contact region; and send instructions to the actinic radiation source to polymerize a region of the initial fluid film on the initial substrate contact region, prior to the superstrate coming into contact with the remaining plurality of droplets on the substrate.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF THE FIGURES

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

FIGS. 3A-3I are illustrations showing the state of portions of an embodiment during a shaping process as performed by an embodiment.

FIGS. 5A-4F are illustrations showing the state of portions of an embodiment during a shaping process as performed by an embodiment.

Figures 1, 2:
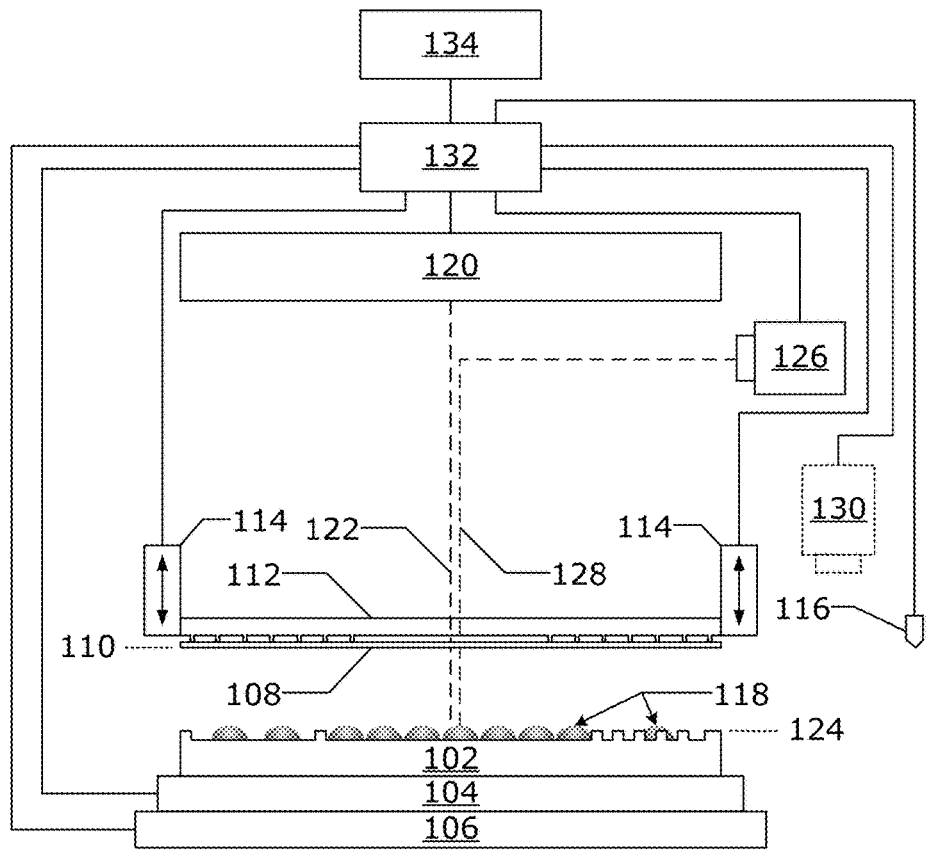
FIG. 1 is an illustration of an exemplary adaptive planarization system having a superstrate with a mesa spaced apart from a substrate as used in an embodiment.
FIG. 2 is a flowchart illustrating an exemplary imprinting method as used in an embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

The IAP technique can be used to shape a film on a substrate from a formable material. The shaping process includes dispensing formable material onto a substrate; bringing a superstrate into contact with the formable material; curing the formable material while the superstrate is in contact with the formable material; and separating the superstrate from the cured formable material.

As soon as the superstrate is brought into contact with the formable material, the formable material starts to change shape in a dynamic manner. A top surface of the formable material is dynamic and can change significantly until the shape of the top surface is substantially frozen during the curing step. The substrate will often have significant topography and if a planar top surface is desired then the thickness of the formable material will also have to vary across the substrate. What is also often desired is that the top surface of the shaped film be planar over an area of a die corresponding to an article to be manufactured from the substrate.

The thickness of the formable material at a given location may vary significantly due to substrate pattern topography and desired top surface variation. Variation in the top surface may be desired for any of a number of reasons including but not limited to: to compensate for volume change due to the curing process, shrinkage of the formable material due to settling; shrinkage of the formable material due to subsequent semiconductor processing such as baking.

The time period over which a superstrate is in contact with the formable material can vary from milliseconds to minutes. As the contact time increases, the effect of formable material redistribution underneath the superstrate increases. In addition, the greater the thickness of a film formed between the superstrate and the substrate the faster the formable material redistributes. The applicant has found that it can be difficult to obtain target characteristics of the cured film over the entire substrate as the contact time increases.

IAP System

FIG. 1 is an illustration of an adaptive planarization system 100 in which an embodiment may be implemented. The adaptive planarization system 100 is used to produce a shaped film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, ψ, and φ-axes. The substrate positioning stage 106, the substrate 102, and the substrate chuck 104 may also be positioned on a base (not shown). The substrate positioning stage may be a part of a positioning system. In an alternative embodiment, the substrate chuck 104 may be attached to the base.

Spaced-apart from the substrate 102 is a superstrate 108. The superstrate 108. The superstrate 108 has a shaping surface 110 on the front side of the superstrate 108. The shaping surface 110 is planar and is used to planarize the formable material 118.

Superstrate 108 may be coupled to a superstrate chuck 112. In an embodiment the superstrate chuck 112 is a multizone chuck. The superstrate chuck 112 may be, but is not limited to: vacuum chuck, pin-type chuck, groove-type chuck, electrostatic chuck, electromagnetic chuck, and/or other similar chuck types. The superstrate chuck 112 may be configured to apply one or more of: stress; pressure; and strain to superstrate 108, that varies across the superstrate 108. The superstrate chuck 112 may include a system such as a vacuum system, an actuator array, a pressure bladder, etc. which can apply a pressure differential to a back surface of the superstrate 108 causing the superstrate 108 to bend and deform. The superstrate chuck may be substantially transparent to actinic radiation.

The superstrate chuck 112 may be coupled to a superstrate positioning head 114 which is a part of the positioning system. The superstrate positioning head 114 may be moveably coupled to a bridge (not shown). The superstrate positioning head 114 may include one or more actuators such as voice coil motors, piezoelectric motors, linear motor, nut and screw motor, etc., which are configured to move the superstrate chuck 112 relative to the substrate in at least the z-axis direction, and potentially other directions (e.g. x, y, θ, ψ, and φ-axes).

The adaptive planarization system 100 may further comprise a fluid dispenser 116. The fluid dispenser 116 may also be moveably coupled to the bridge. In an embodiment, the fluid dispenser 116 and the superstrate positioning head 114 share one or more or all positioning components. In an alternative embodiment, the fluid dispenser 116 and the superstrate positioning head 114 move independently from each other. The fluid dispenser 116 may be used to deposit liquid formable material 118 (e.g., polymerizable material) onto the substrate 102 in a pattern. Additional formable material 118 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 118 being deposited onto the substrate 102. The formable material 118 may be dispensed upon the substrate 102 before and/or after a desired volume is defined between the shaping surface 110 and the substrate surface 124 depending on design considerations. The formable material 118 may comprise a mixture including a monomer as described in U.S. Pat. Nos. 7,157,036 and 8,076,386, both of which are herein incorporated by reference.

Different fluid dispensers 116 may use different technologies to dispense formable material 118. When the formable material 118 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The adaptive planarization system 100 may further comprise a curing system. The curing system induces a phase change in the liquid formable material into a solid material whose top surface reflects the shape of the shaping surface. The curing system may supply energy to the formable material inducing the phase change. The curing system may include at least a radiation source 120 that directs actinic energy towards the formable material 118 under the superstrate 108 along an exposure path. In an embodiment, the actinic energy may be directed through both the superstrate chuck 112 and superstrate 108 towards the formable material 118 under the superstrate 108.

The superstrate positioning head 114 and the substrate positioning stage 106 may be configured to position the superstrate 108 and the substrate 102 in superimposition with the exposure path 122. The radiation source 120 sends the actinic energy along the exposure path 122 after the superstrate 108 has contacted the formable material 118. FIG. 1 illustrates the exposure path 122 when the superstrate 108 is not in contact with the formable material 118, this is done for illustrative purposes so that the relative position of the individual components can be easily identified. An individual skilled in the art would understand that exposure path 122 would not substantially change when the superstrate 108 is brought into contact with the formable material 118. The radiation source 120 may include one or more radiation sources. The radiation source 120 may include and/or may be optically connected to a plurality optical of components that guide, filter, and shape the actinic radiation that is incident on the formable material 118. The plurality of optical components may include but are not limited to one or more of: lenses; mirrors; filters; apertures; SLMs; adaptive optics; beam splitters; beam combiners; prisms; etc.

The adaptive planarization system 100 may further comprise a spread camera 126 that is positioned to view the spread of formable material 118 after the superstrate 108 has made contact with the formable material 118. FIG. 1 illustrates an optical axis 128 of the field camera's imaging field as a dashed line. As illustrated in FIG. 1 the adaptive planarization system 100 may include one or more optical components (dichroic mirrors, beam combiners, prisms, lenses, mirrors, etc.) along the optical path 128 which combine the actinic radiation from the exposure path 122 with light to be detected by the spread camera 126. The spread camera 126 may be configured to detect the spread of formable material under the superstrate 108. The optical axis 128 of the spread camera 126 as illustrated in FIG. 1 may be bent by one or more optical components or may be straight. The spread camera 126 may include one or more of a CCD, a sensor array, a line camera, a plurality of CCDs, and a photodetector which are configured to gather light that has a wavelength that shows a contrast between regions underneath the superstrate 108 that are in contact with the formable material, and regions underneath the superstrate 108 which are not in contact with the formable material 118. The spread camera 126 may be configured to gather monochromatic images of visible light. The spread camera 126 may be configured to provide images of the spread of formable material 118 underneath the superstrate 108; the separation of the superstrate 108 from cured formable material; and can be used to keep track of the shaping process. The spread camera 126 may also be configured to measure interference fringes, which change as the formable material 118 spreads between the gap between the shaping surface 110 and the substrate surface 124.

The adaptive planarization system 100 may further comprise a droplet inspection system 130 that is separate from the spread camera 126. The droplet inspection system 130 may include one or more of a CCD, a camera, a line camera, and a photodetector. The droplet inspection system 130 may include one or more optical components such as a lenses, mirrors, apertures, filters, prisms, polarizers, windows, adaptive optics, and/or light sources. The droplet inspection system 130 may be positioned to inspect droplets prior to the shaping surface 110 contacting the formable material 118 on the substrate 102.

The adaptive planarization system 100 may further include a thermal radiation source (not shown) which may be configured to provide a spatial distribution of thermal radiation to one or both of the superstrate 108 and the substrate 102. The thermal radiation source may include one or more sources of thermal electromagnetic radiation that will heat up one or both of the substrate 102 and the superstrate 108 and does not cause the formable material 118 to solidify. The thermal radiation source may include a spatial light modulator such as a digital micromirror device (DMD), Liquid Crystal on Silicon (LCoS), Liquid Crystal Device (LCD), etc., to modulate the spatio-temporal distribution of thermal radiation. The adaptive planarization system 100 may further comprise one or more optical components which are used to combine the actinic radiation, the thermal radiation, and the radiation gathered by the spread camera 126 onto a single optical path when the superstrate 108 comes into contact with the formable material 118 on the substrate 102. The thermal radiation source may send the thermal radiation along a thermal radiation path after the superstrate 108 has contacted the formable material 118.

Prior to the formable material 118 being dispensed onto the substrate, a substrate coating (not shown) may be applied to the substrate 102. In an embodiment, the substrate coating may be an adhesion layer. In an embodiment, the substrate coating may be applied to the substrate 102 prior to the substrate being loaded onto the substrate chuck 104. In an alternative embodiment, the substrate coating may be applied to substrate 102 while the substrate 102 is on the substrate chuck 104. In an embodiment, the substrate coating may be applied by spin coating, dip coating, etc. In an embodiment, the substrate 102 may be a semiconductor wafer.

The adaptive planarization system 100 may include an atmosphere control system such as gas and/or vacuum system, an example of which is described in U.S. Patent Publication Nos. 2010/0096764 and 2019/0101823 which are hereby incorporated by reference. The gas and/or vacuum system may include one or more of pumps, valves, solenoids, gas sources, gas tubing, etc. which are configured to cause one or more different gases to flow at different times and different regions. The gas and/or vacuum system may be connected to a first gas transport system that transports gas to and from the edge of the substrate 102 and controls the imprint field atmosphere by controlling the flow of gas at the edge of the substrate 102 and superstrate 108.

The adaptive planarization system 100 may be regulated, controlled, and/or directed by one or more processors 132 (controller) in communication with one or more components and/or subsystems such as the substrate chuck 104, the substrate positioning stage 106, the superstrate chuck 112, the superstrate positioning head 114, the fluid dispenser 116, the radiation source 120, the thermal radiation source, the spread camera 126, imprint field atmosphere control system, and/or the droplet inspection system 130. The processor 132 may operate based on instructions in a computer readable program stored in a non-transitory computer readable memory 134. The processor 132 may be or include one or more of a CPU, MPU, GPU, ASIC, FPGA, DSP, and a general-purpose computer. The processor 132 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the superstrate positioning head 114, the substrate positioning stage 106, or both varies a distance between the shaping surface 110 and the substrate 102 to define a desired space (a bounded physical extent in three dimensions) that is filled with the formable material 118. For example, the superstrate positioning head 114 may apply a force to the superstrate 108 such that the shaping surface 110 is in contact with the formable material 118. After the desired volume is filled with the formable material 118, the radiation source 120 produces actinic radiation (e.g. UV, 248 nm, 280 nm, 350 nm, 365 nm, 395 nm, 400 nm, 405 nm, 435 nm, etc.) causing formable material 118 to cure (solidify, and/or cross-link); conforming to a shape of the substrate surface 124 and the shaping surface 110, defining a layer on the substrate 102. The formable material 118 is cured while the superstrate 108 is in contact with formable material 118, forming the layer on the substrate 102.

The cured layer may be formed such that it has a residual layer having a top layer thickness (TLT) that is a minimum thickness of formable material 118 between the substrate surface 124 and the shaping surface 110 in across the planarization area of the substrate.

Superstrate

In an embodiment, the superstrate 108 is substantially transparent to actinic radiation provided by the radiation source 120. In the present context, substantially transparent means greater than 90%. In an embodiment, the area of the shaping surface 110 is equal to or greater than an article yielding area of the substrate. The shaping surface 110 may include an edge treatment which includes a recessed area surrounding the shaping surface 110.

The superstrate 108 may be formed from such materials including, but not limited to: fused silica; quartz; silicon; organic polymers; siloxane polymers; borosilicate glass; fluorocarbon polymers; metal; hardened sapphire; and/or the like. In an embodiment, the shaping surface 110 may have a limited number of recesses or protrusions which do not impact the primary purpose of the superstrate which is to obtain a primarily planar top surface of the formable material.

In an embodiment, the shaping surface 110 may be inset from an outer edge of the superstrate by 3, 4, 5 mm, or more.

In an embodiment, an average thickness of the superstrate may be: 1, 0.9, 0.8, 0.7, 0.6, 0.5, 0.5, 0.4, 0.3 mm or less.

In an embodiment, the shaping surface 110 may have a surface roughness (Ra) or 100, 10, 1, 0.5, 0.2, 0.1 nm or less.

Shaping Process

FIG. 2 is a flowchart of a method of manufacturing an article (device) that includes a shaping process 200 by the adaptive planarization system 100 that can be used to shape the formable material 118 on the substrate. The shaping process 200 may be performed repeatedly on a plurality of substrates 102 by the adaptive planarization system 100. The processor 132 may be used to control the shaping process 200. The shaping process 200 may be used to planarize the substrate 102.

The beginning of the shaping process 200 may include a superstrate mounting step causing a superstrate conveyance mechanism to mount a superstrate 108 onto the superstrate chuck 112. The shaping process may also include a substrate mounting step, the processor 132 may cause a substrate conveyance mechanism to mount the substrate 102 onto the substrate chuck 104. The substrate may have one or more coatings and/or structures. The order in which the superstrate 108 and the substrate 102 are mounted onto the adaptive planarization system 100 is not particularly limited, and the superstrate 108 and the substrate 102 may be mounted sequentially or simultaneously. A single superstrate 108 may be used to shape formable material on a plurality of substrates.

In a positioning step, the processor 132 may cause one or both of the substrate positioning stage 106 and/or a dispenser positioning stage to move the substrate 102 relative to a fluid dispense position below the fluid dispenser 116. In a dispensing step S202, the processor 132 may cause the fluid dispenser 116 to dispense formable material onto the substrate 102. In an embodiment, the fluid dispenser 116 dispenses the formable material 118 as a plurality of droplets. The fluid dispenser 116 may include one nozzle or multiple nozzles. The fluid dispenser 116 may eject formable material 118 from the one or more nozzles simultaneously. The substrate may be moved relative to the fluid dispenser 116 while the fluid dispenser is ejecting formable material 118. In an embodiment, during the dispensing step S202, the formable material 118 may be dispensed onto a substrate in accordance with drop pattern received from the processor 132 and stored in the memory 134. The drop pattern may include information such as one or more of position to deposit drops of formable material, the volume of the drops of formable material, type of formable material, shape parameters of the drops of formable material, etc. In an embodiment, the drop pattern may include only the volumes of the drops to be dispensed and the location of where to deposit the droplets.

After, the droplets are dispensed, then a contacting step S204 may be initiated at a contact time $t_c$, the processor 132 may cause one or both of the substrate positioning stage 106 and a superstrate positioning stage to bring the shaping surface 110 of the superstrate 108 into contact with the formable material 118 on the substrate.

During a spreading step S206, the formable material 118 then spreads out towards the edge of the substrate over a spreading period. How the formable material 118 spreads and fills the substrate surface 124 can be observed via the spread camera 126 and may be used to track a progress of a fluid front of formable material.

In a curing step S208, the processor 132 may send instructions to the radiation source 120 to send a curing illumination pattern of actinic radiation along the exposure path through the shaping surface 110. The curing illumination pattern provides enough energy to cure (polymerize, solidify, etc.) the formable material 118 under the shaping surface 110.

In a separation step S210, the processor 132 uses one or more of the substrate chuck 104, the substrate positioning stage 106, superstrate chuck 112, and the superstrate positioning head 114 to separate the shaping surface 110 from the cured formable material on the substrate 102.

In an embodiment, after the shaping process 200 is finished additional semiconductor manufacturing processing is performed on the substrate 102 in a processing step S212 so as to create an article of manufacture (e.g. semiconductor device). In an embodiment, each substrate 102 includes a plurality of devices.

The further semiconductor manufacturing processing in processing step S212 may include etching processes to transfer a relief image into the substrate that corresponds to the pattern in the cured layer or an inverse of that pattern. The further processing in processing step S212 may also include known steps and processes for article fabrication, including, for example, inspection, curing, oxidation, layer formation, deposition, doping, planarization, etching, formable material removal, dicing, bonding, packaging, and the like. The substrate 102 may be processed to produce a plurality of articles (devices).

Contacting Step

Figure 3A:
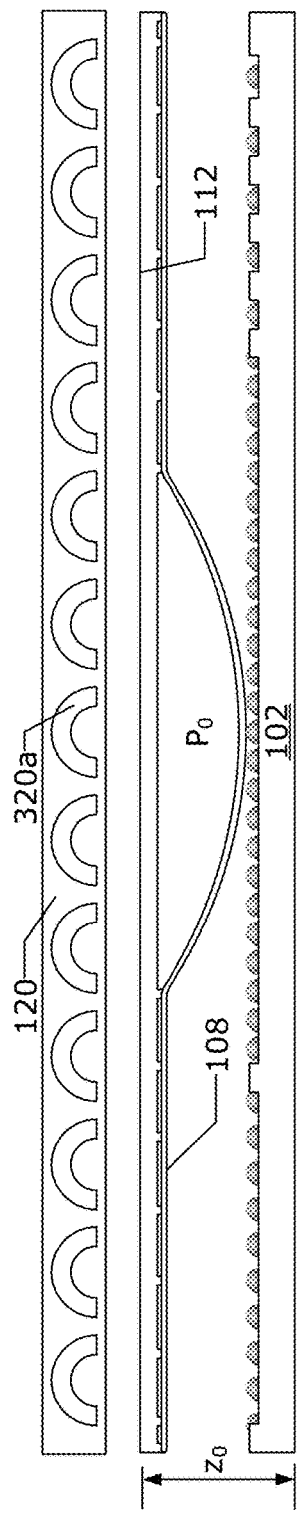

During the contacting step S204, the applicant has found it useful to initially contact a small portion of the formable material 118 with the shaping surface 110 at an initial contact time $t_c$ as illustrated in FIG. 3A. Please note that FIGS. 3A-3I are not scale. The values described in this paragraph are typical values and describe the current state of the art and should not be considered limiting and merely used to describe the scale of the elements in a preferred embodiment. The typical topography on the substrate is between 1 nm and 500 nm in height. The typical width of the recesses and protrusions on the substrate are between 10 nm and 2 mm. The typical droplets of formable material may be between 0.6-10 picolitres. The typical average diameter of the droplets may be between 1 μm and 100 μm. The typical diameter of a substrate is between 100-300 mm.

The adaptive planarization system 100 initially contacts only a portion of the formable material by adjusting an initial pressure $P_0$ and the initial relative displacement $z_0$ at the initial contact time $t_c$. The initial relative displacement $z_0$ is the distance between a substrate reference plane relative to the substrate chuck and a superstrate reference plane relative to the superstrate chuck. The initial pressure $P_0$ is the positive pressure applied to one zone of the superstrate chuck which causes the superstrate to bow out.

Figure 3B:
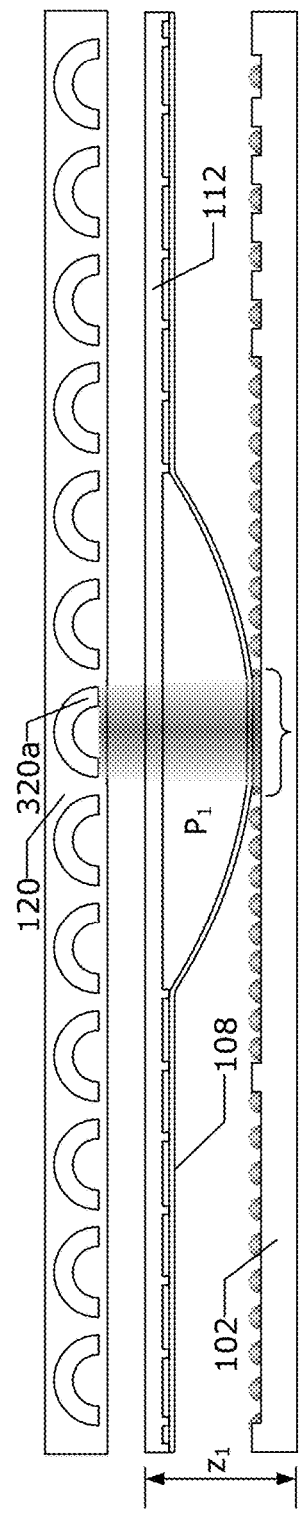

During the contacting step S204, the processor 132 sends instructions to a pressure controller to reduce the positive pressure applied to a portion of the superstrate 108 by the superstrate chuck 112 to $P_1$. The processor 132 also sends instructions to the superstrate positioning head to adjust the relative displacement of the superstrate to a relative displacement $z_1$. As illustrated in FIG. 3B at a time $t_1$, an initial subset of droplets of the plurality of droplets have merged together to form an initial fluid film 318a. The initial fluid film 318a is sandwiched between an initial superstrate contact region and an initial substrate contact region. Over time the positive pressure and the relative displacement are adjusted along a trajectory that allows the bowing of the superstrate to decrease over time as the formable material spreads out over the superstrate as illustrated in FIGS.

3A-3I. This allows the trapped gas that is under the superstrate to escape and prevents the formation of voids.

As the initial fluid film 318a forms, gas escapes and the shaping surface 110 changes locally based on the substrate surface 134, a local volume of formable material, and the period time since the shaping surface 110 contacted the local volume of formable material. Before the shaping surface 110 contacts the formable material, the local shape of the shaping surface is determined mainly by the pressure applied to the back surface of the superstrate by the superstrate chuck. When the shaping surface 110 initially contacts the local volume of formable material the local shape of the shaping surface 110 is mainly determined by the initial local density of formable material that was deposited on the substrate. Over time, the initial local density of formable material has less of an effect and the shape of the substrate surface tends to have a larger impact on the shape of the shaping surface. In an embodiment, the time at which a local volume of formable material is cured is based on when the superstrate surface is closest to a desired local target shape for the top surface of the cured film.

As illustrated in FIG. 3B, a first radiation source 320a may be used to expose an initial portion (region) of the initial fluid film 318a forming a first portion of the cured film 336a. The entire initial fluid film 318a is not cured but a portion of the initial fluid film 318a that has taken on a shape that is close to a desired local target shape is cured to form the first portion of the cured film 336a. The initial portion of the initial fluid film is inset within the contact line of the superstrate with the formable material at the time of curing.

Figure 3C:
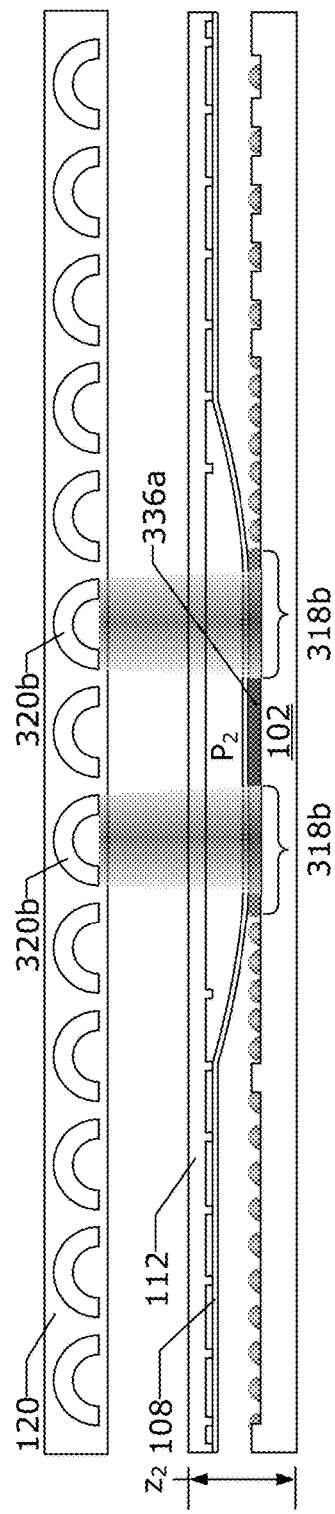

As illustrated in FIG. 3C at a time $t_2$, the pressure applied to a portion of the back surface of the superstrate is changed to a second pressure $P_2$, and the relative displacement is reduced to a second displacement $z_2$, this causes more of the shaping surface to come into contact with the formable material. A second radiation source 320b may be used to expose a second portion of the fluid film 318b when it has taken on a shape that is closest to the target shape forming a second portion of the cured film 336b.

Figure 3D:
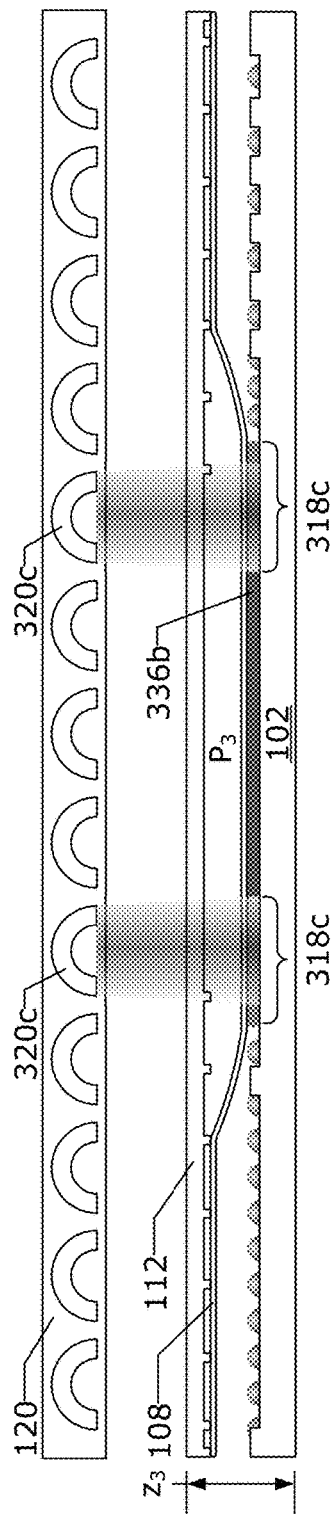

As illustrated in FIG. 3D at a time $t_3$, the pressure applied to a portion of the back surface of the superstrate is changed to a third pressure $P_3$, and the relative displacement is reduced to a third displacement $z_3$, this causes more of the shaping surface to come into contact with the formable material. A third radiation source 320c may be used to expose a third portion of the fluid film 318c when it has taken on a shape that is closest to the target shape forming a third portion of the cured film 336c.

Figure 3E:
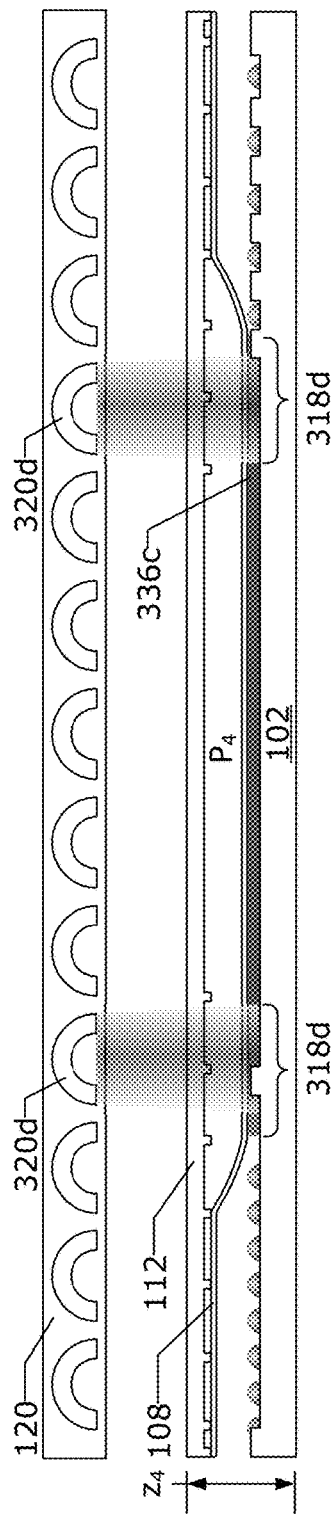

As illustrated in FIG. 3E at a time $t_4$, the pressure applied to a portion of the back surface of the superstrate is changed to a fourth pressure $P_4$, and the relative displacement is reduced to a fourth displacement $z_4$, this causes more of the shaping surface to come into contact with the formable material. A fourth radiation source 320d may be used to expose a fourth portion of the fluid film 318d when it has taken on a shape that is closest to the target shape forming a fourth portion of the cured film 336d.

Figure 3F:
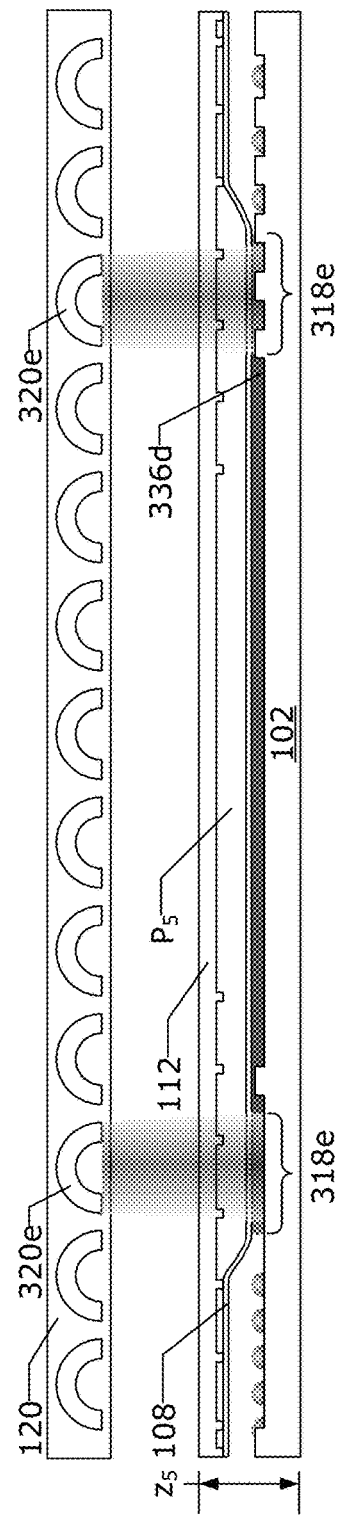

As illustrated in FIG. 3F at a time $t_5$, the pressure applied to a portion of the back surface of the superstrate is changed to a fifth pressure $P_5$, and the relative displacement is reduced to a fifth displacement $z_5$, this causes more of the shaping surface to come into contact with the formable material. A fifth radiation source 320e may be used to expose a fifth portion of the fluid film 318e when it has taken on a shape that is closest to the target shape forming a fifth portion of the cured film 336e.

As illustrated in FIG. 3G at a time $t_6$, the pressure applied to a portion of the back surface of the superstrate is changed to a sixth pressure $P_6$, and the relative displacement is reduced to a sixth displacement $z_5$, this causes more of the shaping surface to come into contact with the formable material. A sixth radiation source 320f may be used to expose a sixth portion of the fluid film 318f when it has taken on a shape that is closest to the target shape forming a sixth portion of the cured film 336f.

As illustrated in FIG. 3H at a time $t_7$, the superstrate may be released from the superstrate chuck and the relative displacement of $z_6$ may be adjusted. This causes the rest of the shaping surface to come into contact with the formable material. A seventh radiation source 320g may be used to expose an outer portion of the fluid film 318g when it has taken on a shape that is closest to the target shape forming an outer portion of the cured film 336g.

In an alternative embodiment, the superstrate 108 is retained by the superstrate chuck 112 while the seventh radiation source 320g is used to form the outer portion of the cured film 336g.

As illustrated in FIG. 3I, the superstrate 108 is separated from the cured film 336 in a separation step S210 which has taken on shape that is close to the target shape.

In an alternative embodiment, an initial amount of actinic radiation is used to give the formable material the desired top shape and then additional actinic radiation is supplied to give the cured film 336 additional properties such as strength and separation resilience.

As the size of the substrates increase, the spread times also increase. For large substrates (e.g. 300 mm in diameter) the spread times can be 10 s of seconds. In an embodiment, the initial contact point is at the center of the substrate and progresses radially outward. In an embodiment, the area near the point of contact will have formed a film before a film is formed at the edge of the substrate. The applicant has determined that it is advantageous to expose portions of the formable material before the formable material forms a film over the entire substrate.

The drop pattern of formable material, the relative displacement of the superstrate and substrate trajectory, and the pressures applied to the back surface of the superstrate trajectory are some of the parameters that are chosen to achieve a specific target top level topography (TLT) in each region of the substrate. The applicant has found that formable material redistributes away from the target TLT. This redistribution has an effect on the ability of the shaping process to meet a target TLT for large (e.g. 300 mm) substrates.

In an embodiment, the formable material is cured while the formable material is still spreading. In an embodiment, the formable material at a specific portion of the substrate is cured a specific amount of time after the formable material has filled that specific portion of the substrate, such that gas has had a chance dissipate from the specific portion and the TLT has reached a target shape.

In an alternative embodiment, one or more radiation sources are scanned across specific portions of the fluid film under the superstrate so as to cure specific portions of the formable material when those specific portions reach a target shape.

In an embodiment, actinic radiation pattern 520 would start near the center of the substrate 102 and proceed in an annular ring radially outward following behind a contact line front 524 forming a cured film 536 under the superstrate as illustrated in FIG. 5A-F. In an embodiment, the drop pattern for the substrate is determined based on the target TLT and a shaping period $\Delta t(x,y)$. The shaping period $\Delta t(x,y)$ is the time period between a contact time $t_c(x,y)$ when the superstrate contacts a particular portion $(x,y)$ of the formable material and a solidification time $t_s(x,y)$ at which the particular portion $(x,y)$ of the formable material is cured ($\Delta t(x,y)=t_s(x,y)-t_c(x,y)$). The fill time $t_f(x,y)$ is a time at which the formable material has merged and filled the particular portion of the substrate with material. The fill time is greater than or equal to the contact time and less than the solidification time ($t_s(x,y) \geq t_f(x,y) > t_c(x,y)$). In an embodiment, $\Delta t(x,y)$ is substantially constant across the substrate and the standard deviation is less than 100 ms.

Figure 4A:
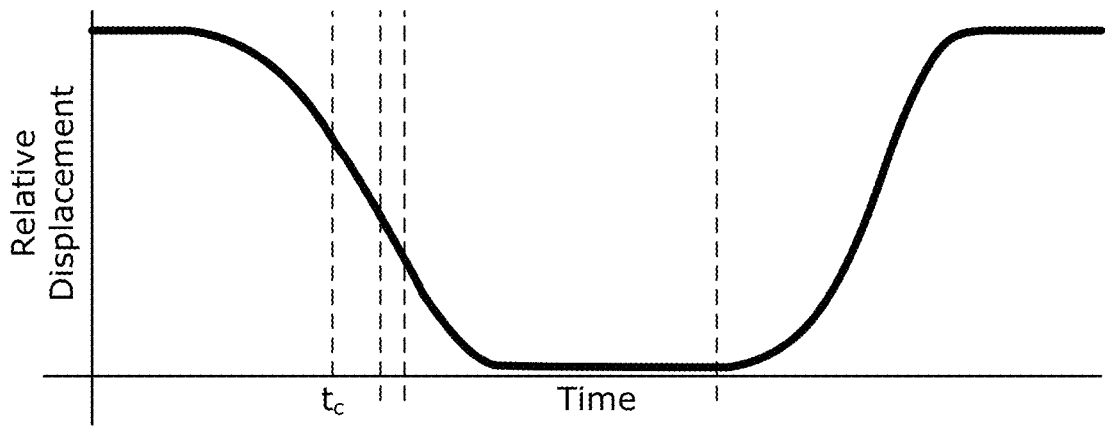
FIGS. 4A-4F are illustrations showing the trajectories of process variables in an embodiment.
Figure 4B:
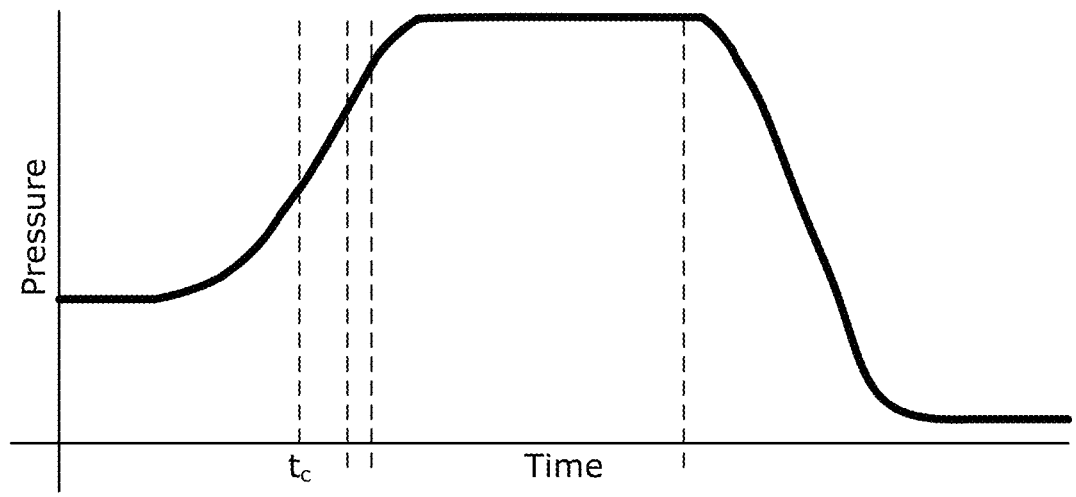
Figure 4C:
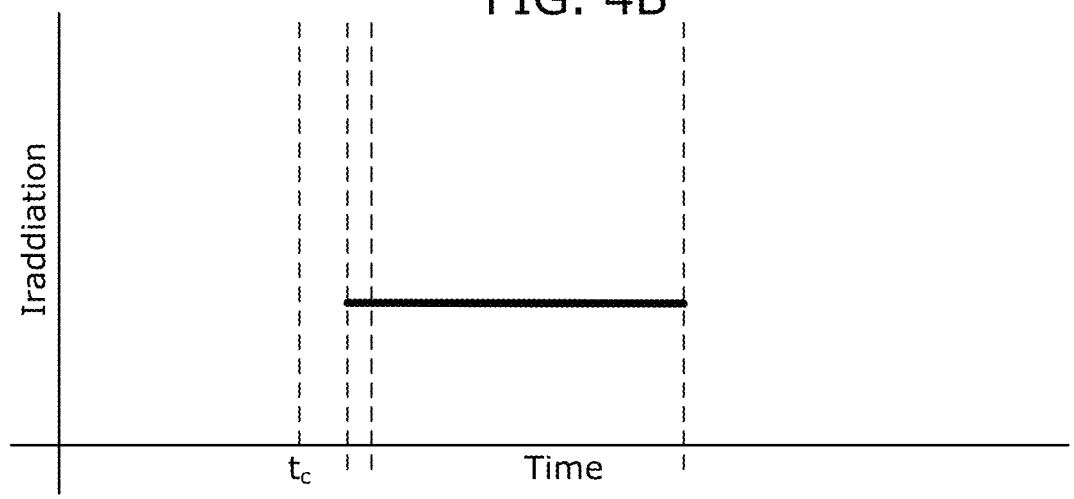
Figure 4D:
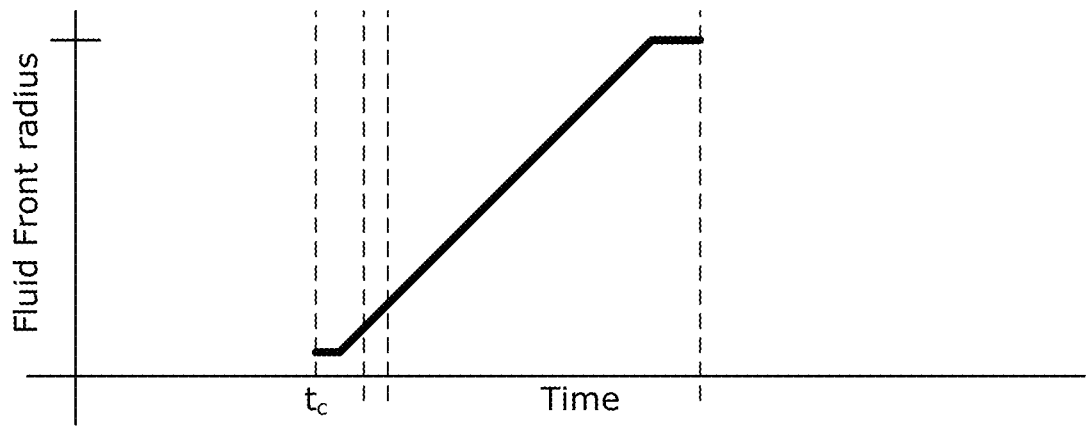
Figure 4E:
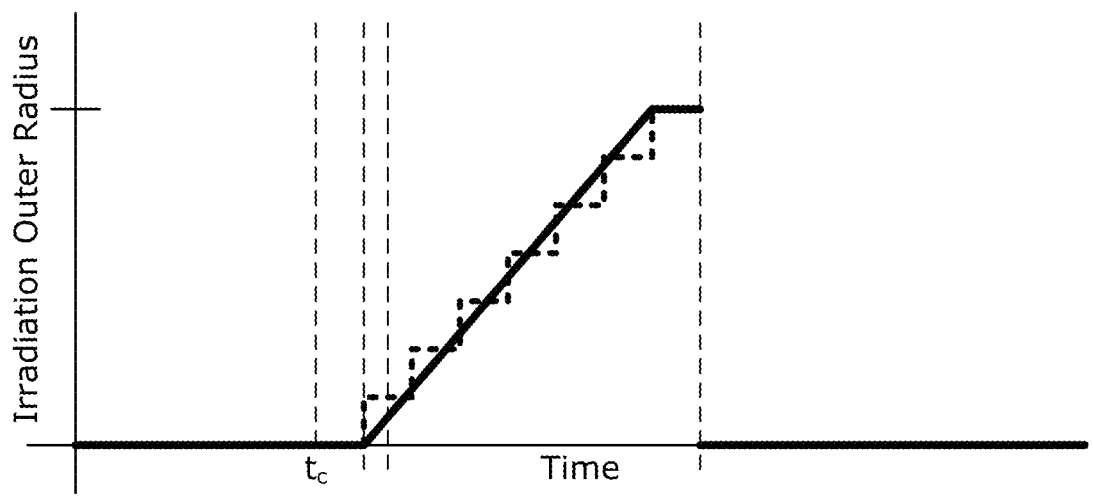
Figure 4F:
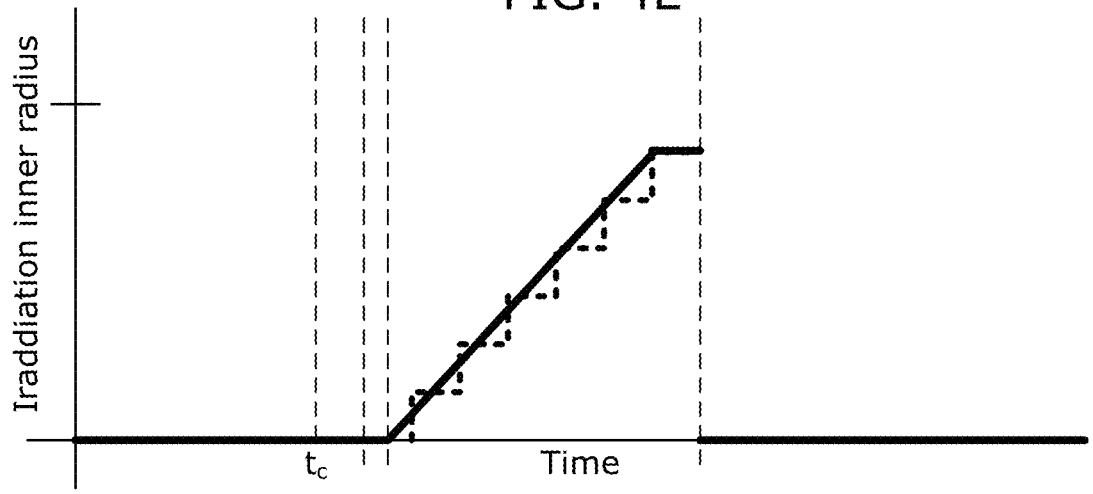
Figure 5A:
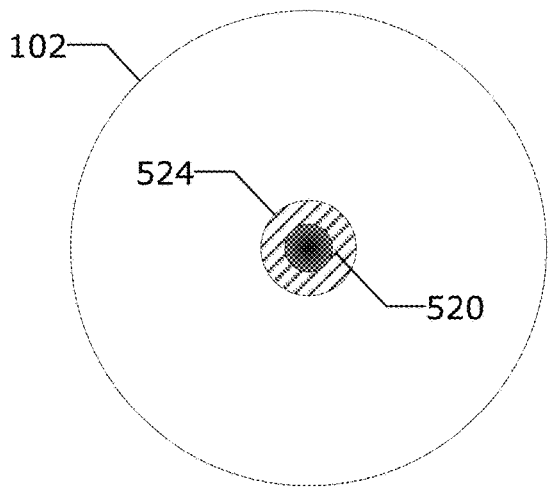
Figure 5B:
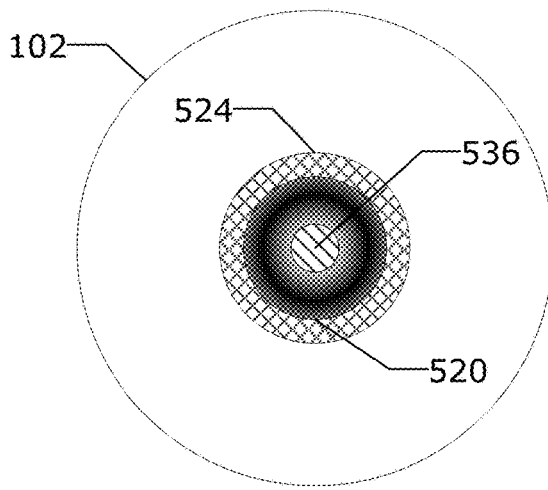
Figure 5C:
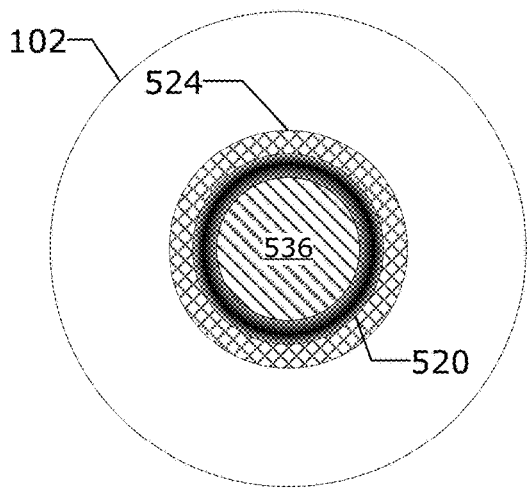
Figure 5D:
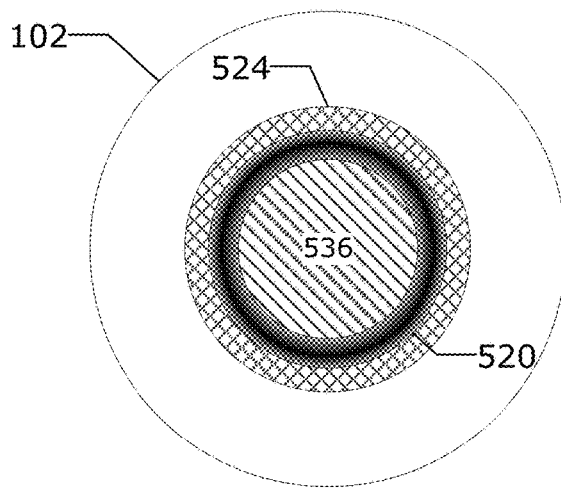
Figure 5E:
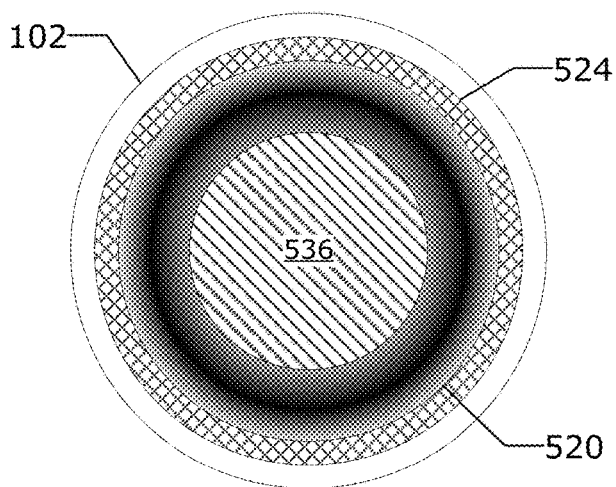
Figure 5F:
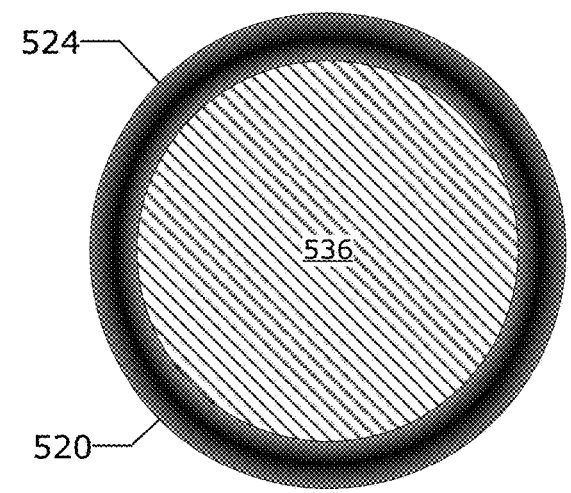

In an embodiment, actinic radiation pattern is an annular region whose inner diameter begins at zero and over time ends at an outer diameter that is less than a radius of the substrate as illustrated in FIG. 4F. In one embodiment, inner radius changes in a step-wise manner as illustrated by the dashed line in FIG. 4F. In a second embodiment, the inner radius varies in smooth manner such as with variable blocking aperture or by adjusting an annular source either within the source or via other optical components.

The outer diameter of the annular region of the actinic radiation begins at an initial diameter ends with an outer diameter that is equal to or greater than the radius of the substrate as illustrated in FIG. 4E. In one embodiment, outer radius changes in a step-wise manner as illustrated by the dashed line in FIG. 4E. In a second embodiment, the inner radius varies in smooth manner such as with a variable aperture or adjusting an annular source either within the source or via other optical components.

In an embodiment, a model such as the one described in U.S. Pat. Nos. 9,718,096 and 9,993,962 which are hereby incorporated by reference are used to determine a drop pattern and a $\Delta t(x,y)$ which is able meet a target TLT. U.S. Pat. Nos. 9,718,096 and 9,993,962 are hereby incorporated by reference. In an embodiment, experiments using a plurality of test drop patterns and fill times are used to determine a drop pattern and a $\Delta t(x,y)$ which is able to meet the target TLT. In an embodiment, the model takes into account the reaction initiation time to determine the $\Delta t(x,y)$ which is able meet a target TLT. The reaction initiation time is a time period between when the region of formable material is first exposed to actinic radiation and when the shape of the formable material takes on the target TLT. The reaction initiation time is a function of the mixture of chemicals in the formable material, the wavelength of the actinic radiation; and the spectral intensity distribution of the actinic radiation.

In an embodiment, the radiation source 126 is configured to provided spatio-temporal distribution of actinic radiation that provides for a $\Delta t(x,y)$ that is desired. FIGS. 3A-I illustrated a radiation source 120 with a plurality of radiation sources 320*a-g* which can be individually controlled to provide the desired spatio-temporal distribution of actinic radiation.

In an embodiment, the radiation source 120 includes a plurality of concentric ring lights. In an embodiment, the concentric ring light surrounds a non-ring light. In an embodiment, the radiation source 120 includes a plurality of LEDs. Each LED among the plurality of LED is configured to target a portion of the formable material under the superstrate. In an embodiment, spatio-temporal distribution of actinic radiation takes on the shape of a traveling ring as illustrated in FIGS. 5A-5F.

In an alternative embodiment, a circular distribution of actinic radiation is supplied with an ever expanding radius that follows behind the fill line of the formable material. This may be accomplished with a plurality of light sources, a plurality of shutters, a plurality of apertures, variable apertures, etc.

In an alternative embodiment, the radiation source 120 includes a spatial light modulator which is configured to supply the spatial temporal distribution which cured the formable material with a pattern that the formed film has target TLT or other desired film characteristics.

In an alternative embodiment, the radiation source 120 includes a tip-tilt mirror or two rotating mirrors which scan actinic radiation across the substrate in a pattern that follows behind the fluid front such that a film with the desired film characteristics such as TLT is formed.

Fluid Redistribution

Figure 6A:
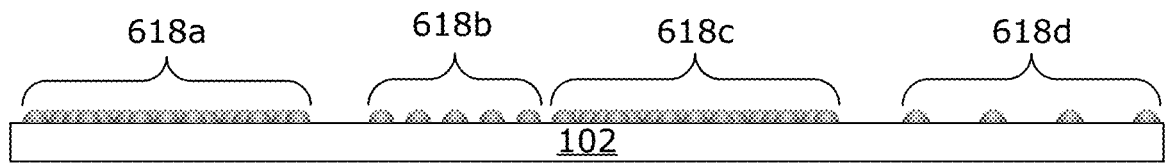
FIG. 6A is an illustration of a spatial distribution of formable material as used in an embodiment.

The applicant has determined that a featureless superstrate can be made to bow and deform based on the underlying fluid density of a drop pattern. The applicant has also determined that over time this deformation disappears and relaxes to a shape that is conformable with the substrate. FIG. 6A is an illustration of substrate with a high density drop pattern 618*a* and 618*c*, a medium density drop pattern 618*b* and a low density drop pattern 618*d*.

Figure 6B:
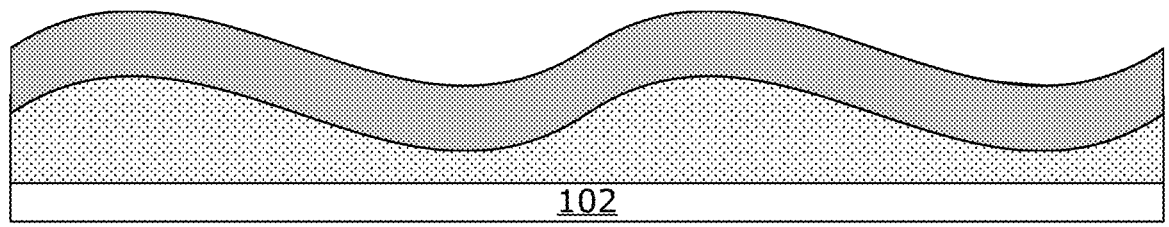
FIGS. 6B-E are illustrations showing the state of portions of an embodiment during a shaping process as performed by an embodiment.
Figure 6C:
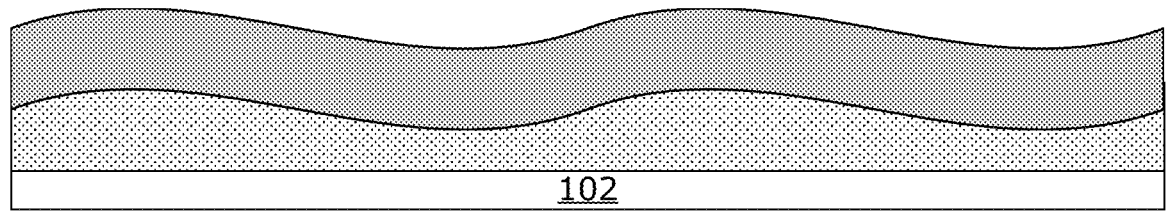
Figure 6D:
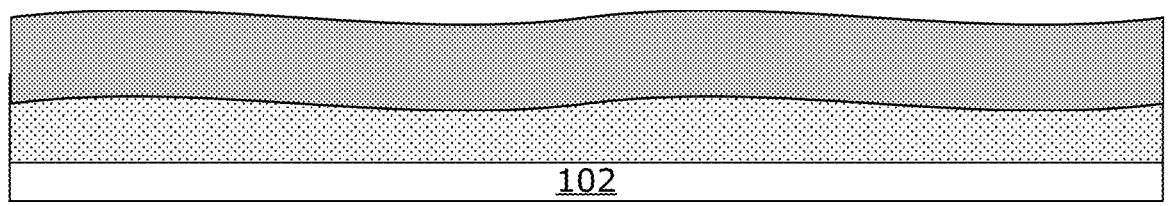
Figure 6E:
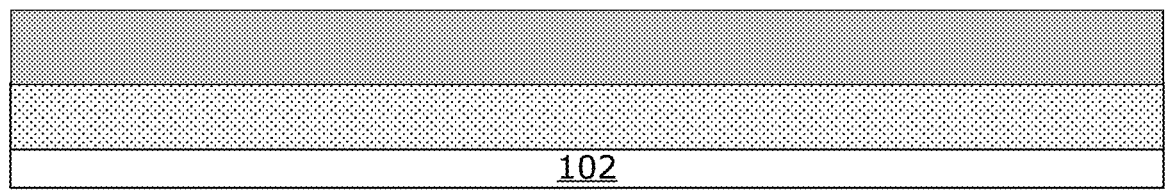

During steps S204 and S206 a superstrate will be initially deformed based on local fluid density as illustrated in FIG. 6B. FIGS. 6C-D illustrate how the formable material redistributes until the superstrate is completely relaxed and conforms to the shape of the substrate as illustrated in FIG. 6E.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method of shaping a film comprising:
   dispensing a polymerizable fluid as a plurality of droplets onto a substrate;
   bringing an initial superstrate contact region of a superstrate into contact with an initial subset of droplets of the plurality of droplets, wherein the initial subset of droplets merge and form an initial fluid film over the initial substrate contact region; and
   prior to the superstrate coming into contact with the remaining plurality of droplets on the substrate, polymerizing a region of the initial fluid film on the initial substrate contact region.

2. The method according to claim 1, wherein the polymerizing step is performed at a time $\Delta t$ after the initial superstrate contact region is brought into contact with the initial subset of droplets, wherein the time $\Delta t$ is selected to yield a polymerized film on the first substrate region having a desired film characteristic.

3. The method according to claim 2, wherein the desired film characteristic is one of: a film thickness of the polymerized film; a top layer thickness (TLT) of the polymerized film; and a surface shape of the polymerized film.

4. The method according to claim 3, wherein the desired film characteristic is a surface shape of the polymerized film that compensates for an overlay error between the superstrate and the substrate.

5. The method according to claim 2, wherein the polymerizing step is initiated by provided actinic radiation to the region of the initial fluid film at a reaction initiation time prior to the time Δt after the initial superstrate contact region is brought into contact with the initial subset of droplets.

6. The method according to claim 1, wherein the polymerizing step is performed by sending actinic radiation through the superstrate and exposing the region of the initial fluid film in the initial substrate contact region to the actinic radiation, while not exposing polymerizable material in the regions surrounding the initial substrate contact region to the actinic radiation.

7. The method according to claim 1, wherein bringing the initial superstrate contact region of the superstrate into contact with the initial subset of droplets of the plurality of droplets comprises:
adjusting a relative position of the superstrate to the substrate; and
adjusting a distribution of pressure applied to a backside of the superstrate.

8. The method according to claim 1, wherein the superstrate is divided into the initial superstrate contact region and a plurality of concentric regions that surround that superstrate contact region, the method further comprising:
adjusting a relative position of the superstrate to the substrate along a relative position trajectory; and
adjusting a distribution of pressure applied to a backside of the superstrate along a distribution of pressure trajectory;
wherein the relative position trajectory and the distribution of pressure trajectory are adjusted such that each of the plurality of concentric regions are sequentially brought into contact with subsets of the plurality of droplets on the substrate forming an expanding fluid film between the superstrate and the substrate.

9. The method according to claim 8, wherein an outer boundary of the expanding fluid film follows a contact line trajectory;
wherein the polymerizing step is performed by sending actinic radiation through the superstrate and exposing the expanding fluid film to the actinic radiation with a spatio-temporal distribution of actinic radiation; and
wherein a spatial component of the spatio-temporal distribution of actinic radiation varies within a period of time during which the superstrate is in contact with the superstrate.

10. The method according to claim 9, wherein an outer boundary of the expanding fluid film follows behind the contact line trajectory; and
wherein the spatial component of the spatio-temporal distribution of actinic radiation follows behind the outer boundary of the expanding fluid film.

11. The method according to claim 1, wherein the polymerizing step is performed by sending a plurality of instructions to a plurality of actinic radiation sources;
wherein the plurality of instructions includes, for each of the plurality of actinic radiation sources, a turn on time and a turn off time, relative to a contact time; and
wherein the contact time is a time at which the initial superstrate contact region is brought into contact with the initial subset of droplets.

12. The method according to claim 11, wherein the turn on time for each of the plurality actinic radiation sources is selected to yield a polymerized film having a desired film characteristic on each region of the substrate associated with each actinic radiation source.

13. The method according to claim 1, wherein the plurality of droplets are arranged on the substrate in a droplet pattern such that a contact shape of portions of the superstrate vary from a non-relaxed state that is non-conformal with portions of the substrate to a relaxed shape that is conformal with the portions of the substrate, over a relaxation period $\Delta t_R$;
wherein the polymerizing step is performed at an exposure time before the end of the relaxation period $\Delta t_R$ for each portion of the substrate associated with a particular source of irradiation among a plurality of radiation sources that provide actinic radiation.

14. The method according to claim 1, wherein a spatial component of a spatio-temporal distribution of actinic radiation that is used polymerize an expanding fluid film of the polymerizable fluid varies within a period of time during which the superstrate is in contact with the superstrate.

15. The method according to claim 1, wherein a spatial component of the spatio-temporal distribution of actinic radiation follows behind the outer boundary of an expanding fluid film of the polymerizable fluid.

16. A method of manufacturing articles including using the method of shaping the film recited in claim 1, the method of manufacturing articles further comprising:
processing the substrate on which the shaped film is produced so as to manufacture the articles.

17. A system for shaping films on a substrate comprising:
a substrate chuck configured to hold the substrate;
a superstrate chuck configured to hold and distort a superstrate;
a dispenser configured to dispense a polymerizable fluid as a plurality of droplets onto the substrate;
a positioning system configured to move the substrate chuck relative to the superstrate chuck;
actinic radiation source;
a memory; and
a processor configured to:
send instructions to the superstrate chuck and the positioning system to bring an initial superstrate contact region of the superstrate into contact with an initial subset of droplets of the plurality of droplets, wherein the initial subset of droplets merge and form an initial fluid film over the initial substrate contact region; and
send instructions to the actinic radiation source to polymerize a region of the initial fluid film on the initial substrate contact region, prior to the superstrate coming into contact with the remaining plurality of droplets on the substrate.

* * * * *